(12) United States Patent
Stering

(10) Patent No.: US 9,961,777 B2
(45) Date of Patent: May 1, 2018

(54) METHOD FOR CUTTING A CARRIER FOR ELECTRICAL COMPONENTS

(75) Inventor: Bernhard Stering, Stainz (AT)

(73) Assignee: ams AG, Unterpremstaetten (AT)

( * ) Notice: Subject to any disclaimer, the term of this patent is extended or adjusted under 35 U.S.C. 154(b) by 838 days.

(21) Appl. No.: 14/112,233

(22) PCT Filed: Apr. 17, 2012

(86) PCT No.: PCT/EP2012/057009
§ 371 (c)(1),
(2), (4) Date: Dec. 16, 2013

(87) PCT Pub. No.: WO2012/143353
PCT Pub. Date: Oct. 26, 2012

(65) Prior Publication Data
US 2014/0118974 A1 May 1, 2014

(30) Foreign Application Priority Data

Apr. 20, 2011 (DE) .......................... 10 2011 018 295

(51) Int. Cl.
*H05K 3/00* (2006.01)
*H01L 21/48* (2006.01)
(Continued)

(52) U.S. Cl.
CPC ......... *H05K 3/0052* (2013.01); *H01L 21/481* (2013.01); *H01L 21/6835* (2013.01);
(Continued)

(58) Field of Classification Search
CPC .................................................... H05K 3/0052
(Continued)

(56) References Cited

U.S. PATENT DOCUMENTS 5,126,818 A 6/1992 Takami et al.
5,128,282 A 7/1992 Ormond et al.
(Continued)

FOREIGN PATENT DOCUMENTS

CN 1453857 A 11/2003
CN 1531071 A 9/2004
(Continued)

OTHER PUBLICATIONS

Wikipedia, "Dual in-line Package" http://de.wikipedia.org/wiki/Dual_in_line_package, Oct. 8, 2011, pp. 1-3.

*Primary Examiner* — Jason L Vaughan
(74) *Attorney, Agent, or Firm* — McDermott Will & Emery LLP

(57) ABSTRACT

A trench (20) is introduced into a carrier (10) for electrical components (30) on a first surface (O10*a*) of the carrier into the material of the carrier (10). The carrier (10) is cut through by a cut (60) being introduced into the material of the carrier from a second surface (O10*b*) of the carrier (10), said second surface being situated opposite the first surface. The cut is implemented in such a way that the cut (60) runs through the trench (20) on the first surface (O10*a*) of the carrier. By providing a trench (20) in the material layers of the carrier (10) which are near the surface, it is possible to prevent material from breaking out of the carrier during the singulation of devices (1, 2).

14 Claims, 4 Drawing Sheets

Figure 1:
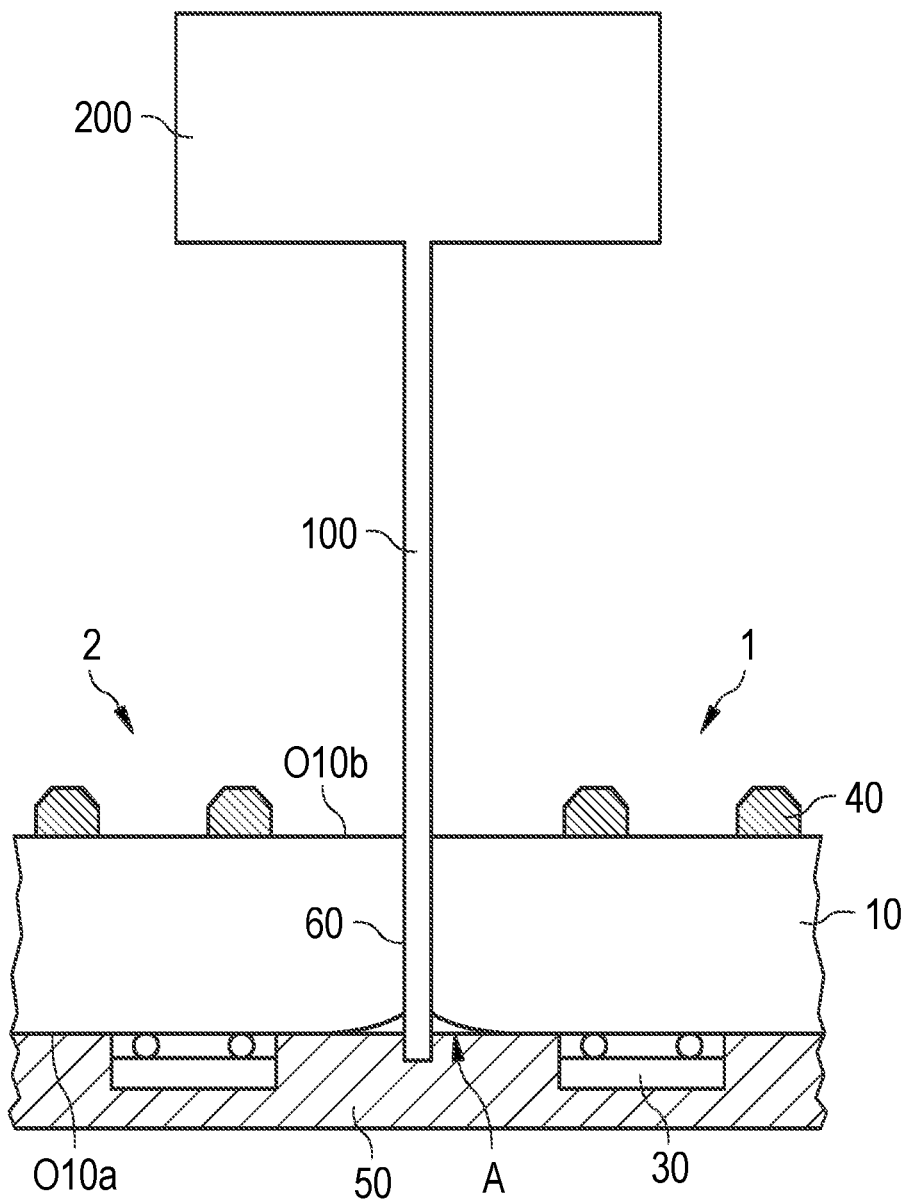

(51) Int. Cl.
  *H01L 23/00* (2006.01)
  *H01L 21/683* (2006.01)
  *H05K 1/18* (2006.01)
  *H01L 21/56* (2006.01)

(52) U.S. Cl.
  CPC ............ *H01L 24/97* (2013.01); *H05K 1/181* (2013.01); *H01L 21/561* (2013.01); *H01L 24/81* (2013.01); *H01L 2221/68331* (2013.01); *H01L 2224/131* (2013.01); *H01L 2224/16225* (2013.01); *H01L 2224/16227* (2013.01); *H01L 2224/97* (2013.01); *H01L 2924/00013* (2013.01); *Y10T 29/49124* (2015.01)

(58) Field of Classification Search
  USPC .................................................. 438/113, 114
  See application file for complete search history.

(56) References Cited

U.S. PATENT DOCUMENTS

| | | | |
|---|---|---|---|
| 5,656,547 A | 8/1997 | Richards et al. | |
| 7,187,060 B2 | 3/2007 | Usui | |
| 7,268,012 B2* | 9/2007 | Jiang ................. | H01L 23/49816 257/778 |
| 7,371,613 B2* | 5/2008 | Shimanuki ............ | H01L 21/561 257/E21.499 |
| 7,553,752 B2 | 6/2009 | Kuan et al. | |
| 7,622,365 B2 | 11/2009 | Parekh | |
| 7,674,689 B2 | 3/2010 | Schneegans et al. | |
| 8,629,532 B2* | 1/2014 | Chen ...................... | B28D 5/022 257/620 |
| 2004/0178500 A1 | 9/2004 | Usui | |
| 2005/0202651 A1 | 9/2005 | Akram | |
| 2006/0189099 A1* | 8/2006 | Lu ........................... | H01L 21/78 438/460 |
| 2007/0267736 A1 | 11/2007 | Shimanuki | |
| 2008/0003720 A1 | 1/2008 | Lu et al. | |
| 2008/0277806 A1* | 11/2008 | Chen ...................... | B28D 5/022 257/618 |
| 2009/0026620 A1* | 1/2009 | Ohta ................... | H01L 21/4857 257/758 |
| 2009/0166844 A1* | 7/2009 | Hu ........................ | H01L 24/97 257/693 |
| 2009/0166895 A1 | 7/2009 | Noguchi et al. | |
| 2010/0072582 A1 | 3/2010 | Chandra et al. | |
| 2011/0115070 A1* | 5/2011 | Lim ...................... | H01L 21/563 257/698 |

FOREIGN PATENT DOCUMENTS

| | | |
|---|---|---|
| DE | 19580514 T1 | 6/1997 |
| EP | 1085570 A2 | 3/2001 |
| EP | 1359612 A2 | 11/2003 |
| WO | 2005/055310 A2 | 6/2005 |
| WO | WO-2009026440 A2 | 2/2009 |

\* cited by examiner

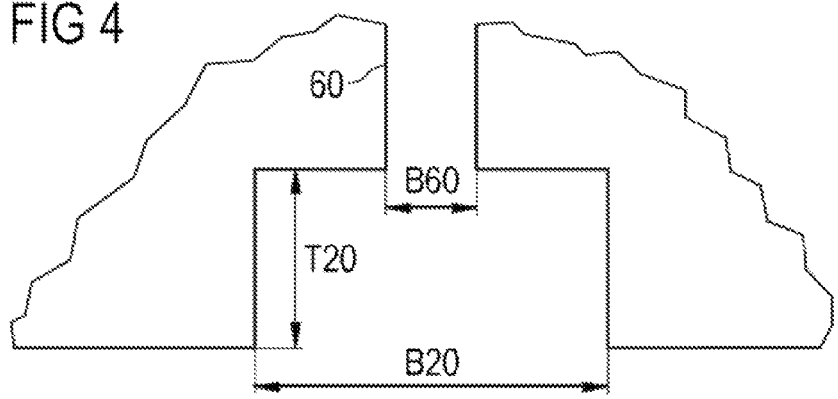
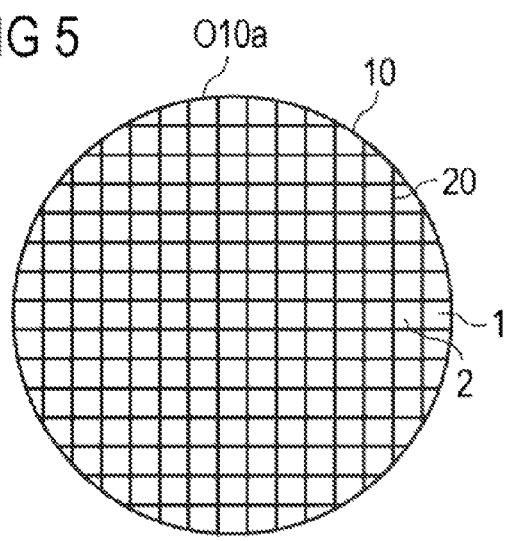
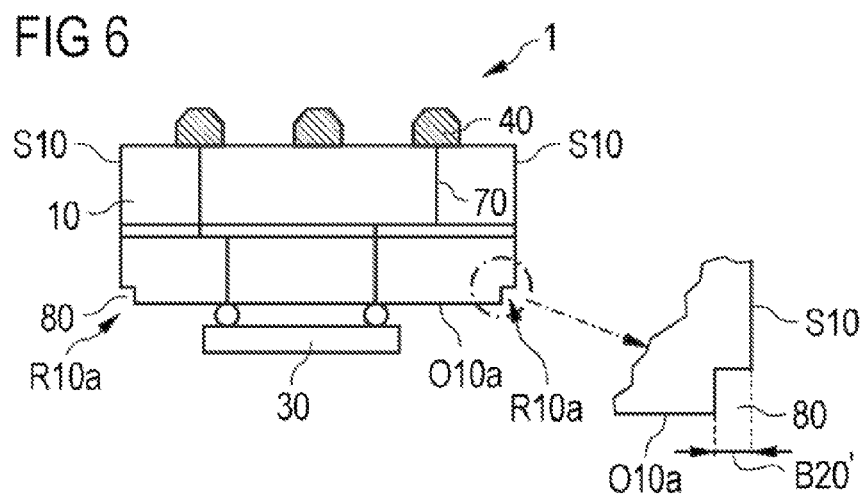

METHOD FOR CUTTING A CARRIER FOR ELECTRICAL COMPONENTS

The invention pertains to a method for cutting, particularly sawing, a carrier for electrical components, in which devices arranged on the carrier are separated.

Electrical devices are manufactured on large-surface carriers or so-called wafers. An electrical device comprises the corresponding carrier on which electrical components and contact terminals for applying or tapping a voltage are arranged. During the manufacture of the electrical devices, the wafer initially contains a plurality of devices that are arranged adjacent to one another on the large-surface carrier. Cuts are produced in the material of the carrier in order to separate the devices. The wafer can be diced for this purpose. In order to prevent the components of a device from being damaged during the separation of the devices, the components need to be arranged at a sufficient distance from a sawing line.

It would be desirable to disclose a method for cutting a carrier for electrical components in which the surface area on the carrier available for the components is as large as possible. Furthermore, an electrical device should be disclosed that is manufactured in accordance with said method.

Embodiments of the method for cutting a carrier for electrical components and embodiments of an electrical component manufactured with the inventive method are disclosed in the claims.

According to one embodiment, a method for cutting a carrier for electrical components in order to separate electrical devices comprises the step of providing a carrier for electrical components. A trench is produced in the material of the carrier on a first surface thereof. The carrier is diced by producing a cut in the material of the carrier from a second surface of the carrier that is situated opposite the first surface, wherein the cut is produced in such a way that it extends through the trench on the first surface of the carrier.

The carrier may feature active surfaces on both sides. For example, the electrical components may be arranged on the first surface of the carrier and contact terminals such as, for example, bumps may be arranged on a second surface of the carrier that is arranged opposite the first surface. The contact terminals may be connected to the components via feedthroughs in the material of the carrier. The second surface may also be equipped with other components such as, for example, with active/passive circuits, sensor panels or detectors. The components may be realized in accordance with CMOS-technology. The carrier is diced by means of a cutting apparatus in order to separate the devices arranged on the carrier. The cutting apparatus may consist of a saw blade. The cutting apparatus is placed onto the second surface of the carrier in order to saw through the carrier.

Due to the trench arranged on the first surface of the carrier, the material of the carrier is largely prevented from chipping off and breaking off the first surface of the carrier when cutting through the material of the carrier from the second surface. The width of the sawing line defines the required spacing between two adjacently arranged components on the carrier that belong to different devices. In comparison with a carrier in which no trenches are provided in the material of the carrier on the first surface and the necessary width of the sawing line amounts, for example, to 80 μm, the width of the sawing line can be significantly reduced, for example, to 50 μm or less depending on the thickness of the wafer/the components by producing a trench in the first surface of the carrier. In this way, the surface area on the first surface available for the arrangement of electrical components can be significantly increased.

An embodiment of an electrical device comprises a carrier with electrical components that are arranged on a first surface of the carrier. On an edge of its first surface, the carrier features a notch that is caused by the production of the trench in the carrier.

Figure 2:
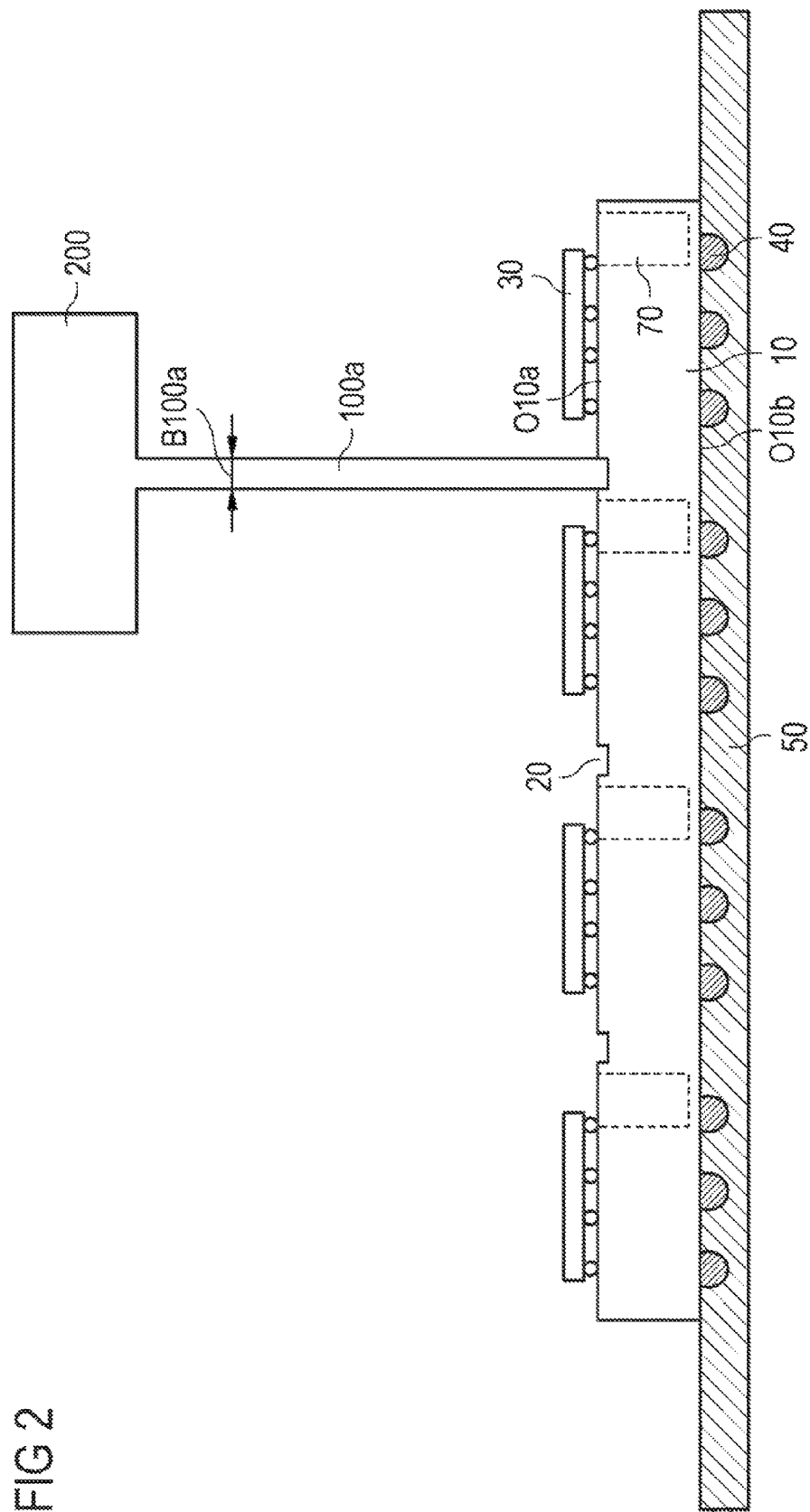
Figure 3:
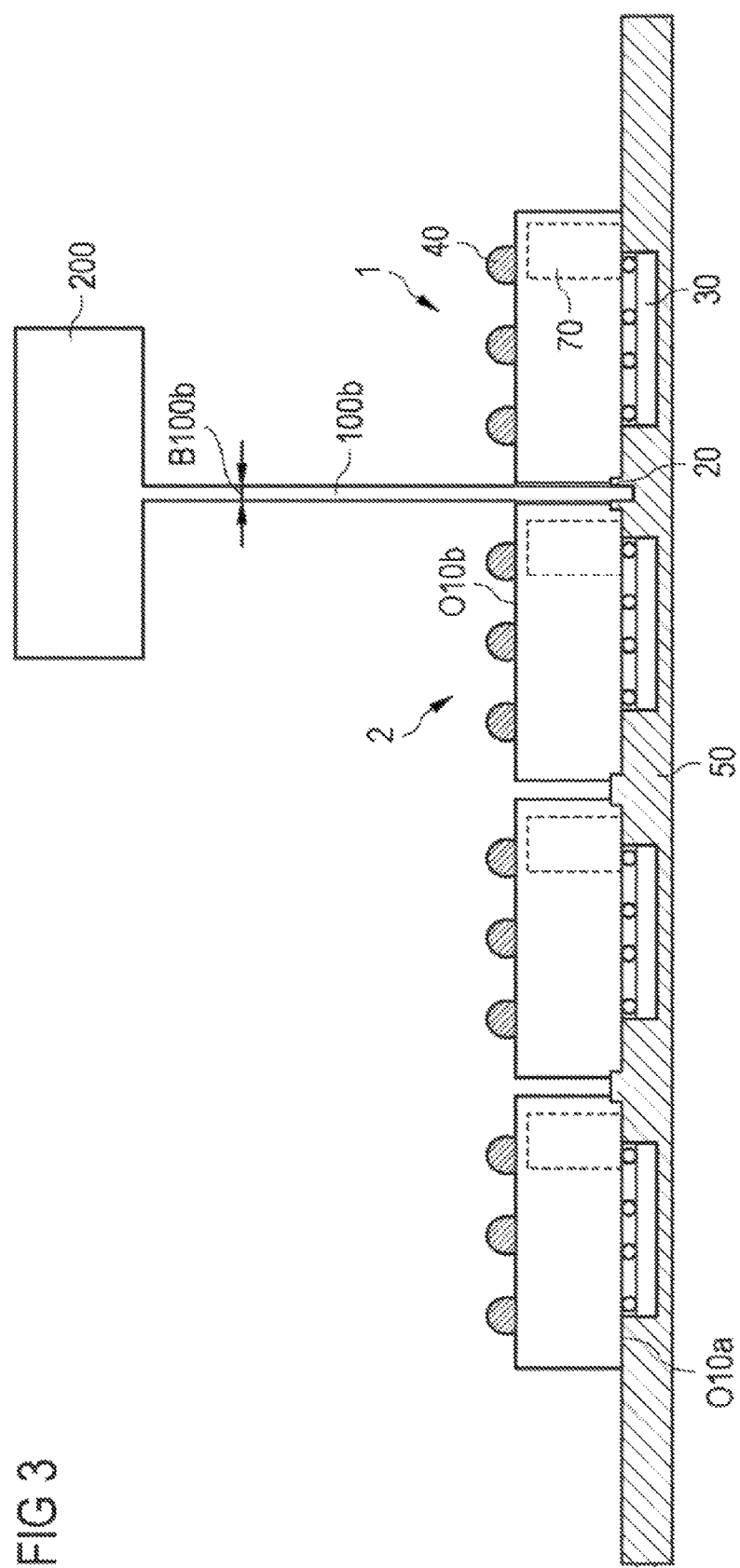

The invention is described in greater detail below with reference to figures that show exemplary embodiments of the present invention. In these figures:

FIG. 1 shows an embodiment of a method for cutting a carrier for electrical components, FIG. 2 shows another embodiment of a method for cutting a carrier for electrical components, in which trenches are produced in the sawing line on one surface of the carrier, FIG. 3 shows another embodiment of a method for cutting a carrier for electrical components, in which cuts are produced through the carrier in order to separate devices, FIG. 4 shows an enlarged representation of an embodiment of a trench produced in a carrier, FIG. 5 shows an embodiment of a method for cutting a carrier, in which trenches are produced in one surface of the carrier, and FIG. 6 shows an embodiment of an electrical device with a notch produced in one surface of the carrier.

In order to manufacture electrical devices, a plurality of the devices is arranged on a carrier such as, for example, a silicon wafer. The wafer is diced with a cutting apparatus in order to separate the devices.

FIG. 1 shows an embodiment of a method for cutting a carrier 10 for electrical devices 1, 2. Each of the devices 1, 2 comprises a section of the carrier 10, electrical components 30 and contact terminals 40. The components 30 may consist, for example, of chip components that are manufactured in accordance with CMOS-technology. They may contain active components and/or passive components such as, for example, inductors, capacitors or surface acoustic wave filters. The electrical components 30 are arranged on a surface O10a of the carrier 10. The contact terminals 40 are arranged on a surface O10b of the carrier 10 that is situated opposite the surface O10a. The connection between the components 30 and the contact terminals 40 is realized with feedthroughs in the material of the carrier 10. The wafer 10 may also feature other devices 30 on the surface O10b. A dicing film 50 is applied onto the surface O10a and covers the surface O10a and the components 30. The film may be coated with an adhesive and applied over the entire carrier 10 in one piece.

The carrier 10 is diced by means of a cutting apparatus 100 in order to separate the electrical devices 1, 2. The cutting apparatus 100 may be realized, for example, in the form of a sawing apparatus with a saw blade. The saw blade is moved by a drive unit 200. In order to separate the electrical devices, the saw blade 100 is placed onto the surface O10b of the carrier and a cut 60 is produced in the carrier 30. The cutting of the saw blade 100 is set such that it completely cuts through the material of the carrier 10. However, the dicing film is not completely cut through. Consequently, the individual devices 1, 2 adhere to the film 50 after the separation.

During the dicing of the carrier 10, material fragments break off the material of the carrier 10 on the surface O10a when the saw blade emerges from the material layers near the surface. On the surface O10b, the saw blade damages the surface in a vicinity of approximately 10 μm around the cut 60, but larger fragments of the material of the carrier 10 break off on the surface O10a. Due to the fragments breaking off and damage to the material, a surface area within approximately 100 μm on both sides of the cut 60 cannot be used as active surface area for the arrangement of components on the surface O10a. For safety reasons, it is assumed, for example, that the width of the sawing line lies between 180 μm and 250 μm, wherein this width is not available as surface area for equipping the surface O10a with components.

FIGS. 2 and 3 show another embodiment of a method for cutting a carrier 10 in order to separate electrical devices 1, 2, 3 and 4. The carrier 10 may consist of a wafer of a silicon material that contains a plurality of devices. Each device comprises a section of the carrier 10, electrical components 30 and contact terminals 40 for applying or tapping a voltage. The devices may feature active surfaces on both sides. The electrical components 30 may be arranged, for example, on a surface O10a of the carrier 10. The contact terminals 40 such as, for example, bumps and/or other electrical components 30 may be arranged on a surface O10b that is situated opposite surface O10a. The electrical components 30 may be connected to the contact terminals 40 via feedthroughs 70 in the interior of the carrier. The components 30 may be manufactured, for example, in accordance with CMOS-technology. They may contain active and passive components such as, for example, capacitors, inductors or surface acoustic wave filters.

The material of the carrier 10 is diced in order to separate the electrical devices 1, 2, 3 and 4. Prior to dicing the complete carrier 10, a trench 20 is produced in the material of the carrier 10 on the surface O10a thereof. The trench may be produced in the material of the carrier with a mechanical processing method such as, for example, sawing. For this purpose, a drive unit 200 may be coupled to a cutting apparatus 100a. The cutting apparatus may feature, for example, a saw blade 100a that has a width B100a, for example, between 15 μm and 80 μm. The cutting apparatus 100a preferably has a width of 40 μm. The width of the sawing line may then amount, for example, to 45 μm. The trenches are produced by sawing into the surface O10a of the wafer. The carrier is not completely diced during this preliminary sawing process, but only the layers of the carrier near the surface are removed.

An etching process may be used alternatively to the sawing process in order to produce the trench 20 in the material of the carrier 10. The trench may be produced in the material of the carrier 10, for example, by means of dry etching. A corresponding mask is used for this purpose. For example, the mask has the width of the carrier.

The carrier is fixed on a film 50 while the trench is produced. The film 50 may be applied onto the surface O10b of the carrier. It may consist, for example, of a film that is coated with adhesive. The film preferably is arranged on the surface O10b of the carrier in such a way that the contact terminals 40 realized, for example, in the form of bumps with a height of 80 μm penetrate into the material of the film and therefore are completely surrounded by the material of the film. In addition, the film directly adheres to the surface O10b of the carrier and, in particular, to the edge of the carrier in an almost hermetically sealed fashion such that contamination of the surface O10b with dirt particles or water can be prevented.

FIG. 3 shows the step of separating the devices 1, 2, 3 and 4. For this purpose, the film 50 is arranged on the surface O10a of the carrier and over the components 30. For example, the film may be coated with an adhesive and applied onto the surface O10a and the components 30.

A cutting apparatus 100b is coupled to a drive unit 200. The carrier 10 is diced with the cutting apparatus 100b in order to separate the devices 1, 2, 3 and 4. The cutting apparatus 100b is placed onto the surface O10b of the carrier in order to dice the carrier 10. The cutting apparatus 100b may feature a saw blade with a saw blade width of 25 μm that approximately corresponds to a sawing line width of 30 μm. In this case, the cutting apparatus 100b is positioned on the surface O10a with a certain positioning accuracy. The positioning accuracy may lie between +/−10 μm, preferably between +/−5 μm. A cut 60 is produced in the material of the carrier 10 while the material of the carrier 10 is diced. The cutting apparatus 100b penetrates into the material of the carrier on the surface O10b and emerges once again on the surface O10a. The cut 60 is produced in such a way that it extends through the trench 20 on the surface O10a. In a preferred embodiment, the cut extends centrally through the trench 20. After the separation of the devices, the individual devices 1, 2, 3 and 4 adhere to the film 50 and can be removed therefrom.

Due to the production of the trench 20 in the surface O10a of the carrier 10, material fragments can be largely prevented from breaking off in the region of the material layers near the surface while sawing through the carrier 10. Consequently, the required spacing between the electrical components 30 of different devices can be reduced in comparison with the embodiment illustrated in FIG. 1. The surface area to be kept clear on the surface O10a can be reduced, for example, to 50 μm.

FIG. 4 shows an enlarged illustration of an embodiment of the trench 20. The trench 20 has a width B20 and a depth T20. The cut 60 produced in the material of the carrier 10 has a width B60, wherein the width B60 essentially corresponds to the width of the saw blade B100. The trench 20 may extend, for example, centrally referred to the cutting line of the cut 60 in the material of the carrier 10. This is the case if the saw blade 100 emerges from the material of the carrier 10 centrally in the trench 20 while sawing through the carrier.

The width of the trench 20 may be respectively chosen in dependence on the width B60 of the cut 60 or the width B100 of the saw blade 100b. The saw blade 100a may be realized wider than the saw blade 100b such that the trench is wider than the width B100b of the saw blade 100b of the sawing apparatus, for example, by 10 μm to 30 μm. Consequently, the trench is wider than the cut for dicing the wafer. Furthermore, the width of the trench may be additionally chosen in dependence on the positioning accuracy with which the cutting apparatus 100b is placed onto the surface O10b of the carrier 10. The trench 20 may be produced in the material of the carrier 10, for example, with a width B20 that respectively corresponds to the width B100b of the saw blade 100b or of the cut 60 plus the positioning accuracy of the cutting apparatus 100b. If the trench is produced by means of the cutting apparatus 100a, the width B100a of the cutting apparatus needs to be chosen accordingly.

For example, if the saw blade 100b has a width B100b between 10 μm and 50 μm and the positioning accuracy lies between +/−5 μm, the trench 20 may have a width B20 between 15 μm and 80 μm. It proved particularly advantageous to produce the trench in the material of the carrier 10 with a width in excess of 20 μm, preferably with a width of 40 μm. In this case, the width B100a of the saw blade may amount, for example, to 40 μm. The trench may be produced in the material of the carrier 10 with a depth T20 from the surface O10a in excess of 10 μm, preferably with a depth of 20 μm.

FIG. 5 shows an embodiment of the carrier 10 prior to the separation. The trenches 20 are arranged in the material of the carrier in a checkerboard-like fashion on the surface O10a of the carrier 10. The trenches may respectively extend perpendicular to one another. In order to separate the electrical devices, the carrier 10 is diced with a cutting apparatus such as, for example, a saw blade, from the surface O10b that is arranged opposite the surface O10a. When the saw blade has completely cut through the material of the carrier 10 and emerges in the trench 20, it is possible to almost entirely prevent material fragments from breaking off the surface O10a. The surface area that cannot be used for equipping the surface O10a with components is defined by the width of the trench 20. Consequently, the surface area to be kept clear between two devices can be significantly reduced in comparison with an embodiment without the trench 20.

FIG. 6 shows an embodiment of an electrical device 1 after the separation. The electrical device 1 features a component 30 that is arranged on the surface O10a of the carrier 10. For example, the contact terminals 40, sensor panels, detectors or other active/passive components are arranged on the surface O10b. The contact terminals 40 are connected to the component 30 via feedthroughs 70 in the material of the carrier 10. The device features lateral surfaces S10 between the surfaces O10a and O10b.

On the edges R10a of the surface O10a, the carrier 10 features a notch 80 that is caused by the trench. The notch may be realized in the form of a recess in the material of the carrier 10. The notch is arranged between the surface O10a and the lateral surface S10 of the device 1. The notch 80 approximately has half the width B20 of the trench 20 minus the width B60 of the cut 60. For example, it may have a width B20' in excess of 10 μm and a depth T20 in excess of 10 μm.

LIST OF REFERENCE SYMBOLS

1 Electrical device
10 Carrier
20 Trench
30 Electrical component
40 Contact terminal
50 Film
60 Cut
70 Feedthrough
80 Notch
100a, 100b Cutting apparatus, saw blade
200 Drive unit

What is claimed is:

1. A method for cutting a carrier for electrical components, comprising the steps of:
   providing a carrier for electrical components, wherein the electrical components are arranged on a first surface of the carrier and contact terminals are arranged on a second surface of the carrier, the second surface being situated opposite to the first surface;
   applying a film onto the second surface of the carrier such that the contact terminals penetrate into a material of the film;
   producing a trench in a material of the carrier on the first surface, wherein the carrier is fixed on the film while the trench is produced;
   arranging the film on the first surface of the carrier such that the film is applied onto a surface of the electrical components; and
   dicing the carrier for separating the electrical components by producing a cut in the material of the carrier from the second surface of the carrier while the film is arranged on the first surface of the carrier and onto the surface of the electrical components, wherein the cut is produced in such a way that it extends through the trench on the first surface of the carrier, and wherein the trench is produced in the material of the carrier with a width that is greater than the width of the cut.

2. The method according claim 1, wherein the cut is produced in the material of the carrier with a cutting apparatus,
   wherein the cutting apparatus is placed onto the second surface of the carrier with a positioning accuracy which lies between +/−5 μm, and
   wherein the width of the trench corresponds to the width of the cutting apparatus plus the positioning accuracy with which the cutting apparatus is placed onto the second surface of the carrier.

3. The method according to claim 2, wherein a saw blade is used as the cutting apparatus, and
   wherein the width of the saw blade of the cutting apparatus is chosen in such a way that the cut has a width between 10 μm and 50 μm.

4. The method according claim 3, wherein the trench is produced in the material of the carrier with an additional cutting apparatus that features a saw blade, and
   wherein the width of the saw blade of the additional cutting apparatus is chosen in such a way that the trench is produced in the material of the carrier with a width between 15 μm and 80 μm.

5. The method according to claim 4, wherein the width of the saw blade of the additional cutting apparatus is chosen in such a way that the trench is produced in the material of the carrier with a width of 40 μm.

6. The method according to claim 3, wherein the cut has a width of 30 μm.

7. The method according to claim 1, wherein the trench is produced in the material of the carrier with a depth in excess of 10 μm.

8. The method according to claim 7, wherein the trench is produced in the material of the carrier with a depth in excess of 20 μm.

9. The method according to claim 1, further comprising the step of:
   mounting the electrical components on the first surface of the carrier.

10. The method according to claim 1, further comprising the step of:
    mounting contact terminals on the second surface of the carrier.

11. The method according to claim 1, wherein the trench is produced in the material of the carrier by means of an etching method, or by means of a mechanical processing method.

12. The method according to claim 11, wherein the trench is produced in the material of the carrier by means of dry etching, or by means of sawing.

13. The method according to claim 1, wherein the carrier is realized in the form of a wafer.

14. The method according to claim 13, wherein the carrier is realized in the form of a silicon material.

* * * * *